United States Patent [19]

Coash

[11] Patent Number: 4,748,688
[45] Date of Patent: May 31, 1988

[54] ELECTROMAGNETIC WAVE RECEIVER

[75] Inventor: Ronald J. Coash, Lincoln, Nebr.

[73] Assignee: Emhart Industries, Inc., Indianapolis, Ind.

[21] Appl. No.: 856,482

[22] Filed: Apr. 28, 1986

[51] Int. Cl.$^4$ .............................................. H04B 1/10
[52] U.S. Cl. ....................................... 455/212; 455/214; 455/222; 455/229
[58] Field of Search .................. 455/35, 212, 214, 218, 455/222, 229

[56] References Cited

U.S. PATENT DOCUMENTS

| | | | |
|---|---|---|---|
| 3,584,304 | 6/1971 | Casterline | 455/218 |
| 3,654,555 | 4/1972 | Ryan et al. | 455/218 |
| 3,876,953 | 4/1975 | Abel | 455/205 |
| 3,962,553 | 6/1976 | Linder et al. | 455/218 |
| 4,013,962 | 3/1977 | Beseke et al. | 455/35 |
| 4,117,406 | 9/1978 | Takahashi et al. | 455/218 |
| 4,144,500 | 3/1979 | Tokunaga | 455/218 |
| 4,146,842 | 3/1979 | Fukushima et al. | 455/214 |
| 4,653,116 | 3/1987 | Lindenmeier et al. | 455/205 |

Primary Examiner—Michael A. Masinick
Attorney, Agent, or Firm—Carl A. Forest

[57] ABSTRACT

A receiver includes a receiving circuit for receiving an electromagnetic carrier wave modulated by a message signal, a detector ciruit for separating the message signal from the carrier wave, and an output circuit. The detector circuit has a Q ratio sufficiently low that the detectable band width is more than twice the modulation frequency change. The detector output signal has a noise voltage level when no carrier is present that is higher than the voltage of the message signal with a carrier present. An output circuit senses the level of the detector output signal and passes signals with a voltage level below a predetermined level and otherwise blocks the output signal. The filtering of the output circuit is sufficiently low that its response time is faster than a tenth of a second. The output circuit includes a noisy input related to the detector output and a reference input. A pair of diodes connect the noisy input and the reference input enabling the reference input to track the noisy input to prevent false data outputs.

4 Claims, 3 Drawing Sheets

| FIG.1A | FIG.1C |
| --- | --- |
| FIG.1B | |

ELECTROMAGNETIC WAVE RECEIVER

BACKGROUND OF THE INVENTION

1. Field of the Invention

The invention, in general, relates to electromagnetic wave receivers and in particular to a receiver that is capable of receiving waves over a broad bandwidth and at the same time having good sensitivity.

2. Description of the Prior Art

Electromagnetic wave receivers in the broadcast band range, UHF (ultrahigh frequency) range, and VHF (very high frequency) range for receiving either FM (frequency modulated) or AM (amplitude modulated) signals are common. The disclosure of the present invention, in order to be specific, will be in terms of a UHF FM receiver, however, it should be understood that the invention is not limited to such receivers. As is conventional in the art, the electromagnetic waves shall be, in certain instances, referred to as rf (radio frequency) waves, however, it should be understood that this does not limit the invention to radio receivers.

FM receivers receive and demodulate an electromagnetic wave comprised of a fundamental carrier frequency modulated by a message signal. At the higher UHF frequencies, say for example, 320 megahertz, it is useful to employ a Surface Acoustic Wave Resonator (SAWR) in the transmitter because such resonators operate efficiently at high frequencies. However, such resonators also are characterized by wide manufacturing tolerances of the fundamental frequency, typically about ±200K hertz and provide modulation frequency changes (deviation) of only about 50-80K hertz. Reception of such signals is difficult or impossible with conventional receivers.

The principal reason for the inability of prior art receivers to receive such signals lies in the design of the detector (sometimes called the demodulator), which is that portion of the receiver which separates the message signal from the carrier wave. Conventional detectors are designed with a relatively high Q value. Q is a dimensionless variable sometimes referred to as the Quality Ratio. It may be defined either in terms of bandwidth, in which case it is given as $Q_{bw} = F_o/\Delta F$ where $F_o$ is the fundamental frequency and $\Delta F$ is the modulation deviation. Or it may be equivalently defined in terms of reactance and resistance as $Q_{zr} = Z/R$ where Z is equal to the difference between the inductive reactance and capacitive reactance and R is the DC or skin effect resistance. Prior to the present invention, it has been thought by those skilled in the art that the Q value of a detector circuit must be kept as high as possible to obtain good sensitivity. This is because a high Q value results in a high signal to noise ratio, which was thought to be necessary for good sensitivity.

As will be seen, the invention in one aspect also relates to the squelch circuitry of the receiver. In conventional FM squelch circuits, the detector output is provided with sufficient capacitive filtering to reduce the noise below a predetermined level which is less than the detector message signal level when a carrier is present. When no carrier is present, the squelch circuit blocks the output signal from the receiver output. When the higher voltage carrier message signal is detected, the output circuit is tripped to gate the detector signal to the output.

In order to obtain the signal to noise ratios required in the prior art detector circuits, it was found necessary to permit the filter capacitors in the circuits to discharge essentially completely. Such discharges generally require times of the order of ½ second. Thus prior art detectors have had response times of the order of ½ second or higher.

SUMMARY OF THE INVENTION

It is an object of the invention to provide a receiver having a broad bandwidth while retaining good sensitivity.

It is another object of the invention to provide a receiver having a detector circuit with low Q.

The low Q value of the invention results in a noise signal. In fact, the noise level of the detector output signal with no carrier present will be greater than the detector output signal level with the carrier present. Those skilled in the art would attempt to reduce this noise level. However, I have instead designed a squelch circuit which utilizes the higher noise level of the no-carrier signal. It is, therefore, a further object of the invention to provide a receiver having a detector output signal level with no carrier present.

It is another object of the invention to provide a receiver with a fast response time compared to prior art receivers.

The invention provides a receiver comprising: means for receiving an electromagnetic carrier wave modulated by a message signal; detector circuit means for separating the message signal from the carrier wave and for providing a detector signal having a signal level when no carrier is present that is higher than the signal level when a carrier is present; and output means responsive to the detector signal for providing an output signal when the level of the detector signal is below a predetermined level. Preferably, the levels are voltage levels and the predetermined level is a voltage level that is less than the voltage level of the detector signal when no carrier is present. Preferably, the output means includes a reference voltage input, an input for inputting a noisy signal related to the detector signal, and a means for enabling the reference voltage input signal to track the noisy input signal to prevent false data outputs.

Preferably, the response time of the output means is less than a tenth of a second, and typically it is 1.5 milliseconds. Preferably, the detectable bandwidth is more than three times as large as the modulation frequency change, and typically it may be ±200K hertz with a modulation frequency deviation of 50-80K hertz. Numerous other features, objects and advantages of the invention will become apparent from the following detailed description when read in conjunction with the accompanying drawings.

BRIEF DESCRIPTION OF THE DRAWINGS

In the drawings:

FIG. 2A shows how, without tracking, the noisy input voltage may cross the reference input voltage and cause a false output turn on; and FIG. 2B shows how tracking of the noisy input by the reference input prevents false turn on.

DESCRIPTION OF THE PREFERRED EMBODIMENT

Figures 1, 1A:
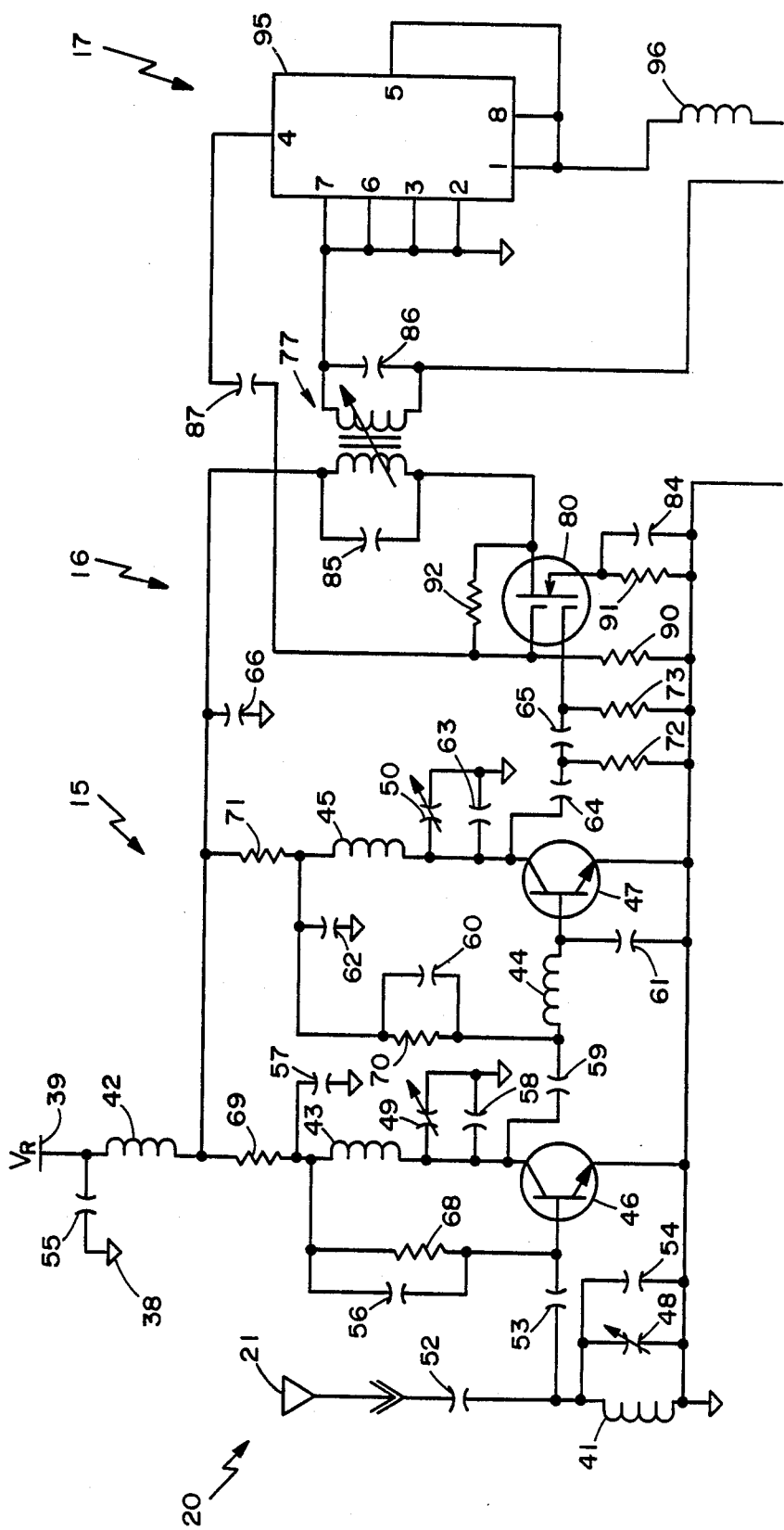
FIG. 1 shows the relationship of FIGS. 1A, 1B and 1C.
FIGS. 1A, 1B and 1C each show a portion of the detailed circuit diagram of a receiver according to the invention
Figure 1B:
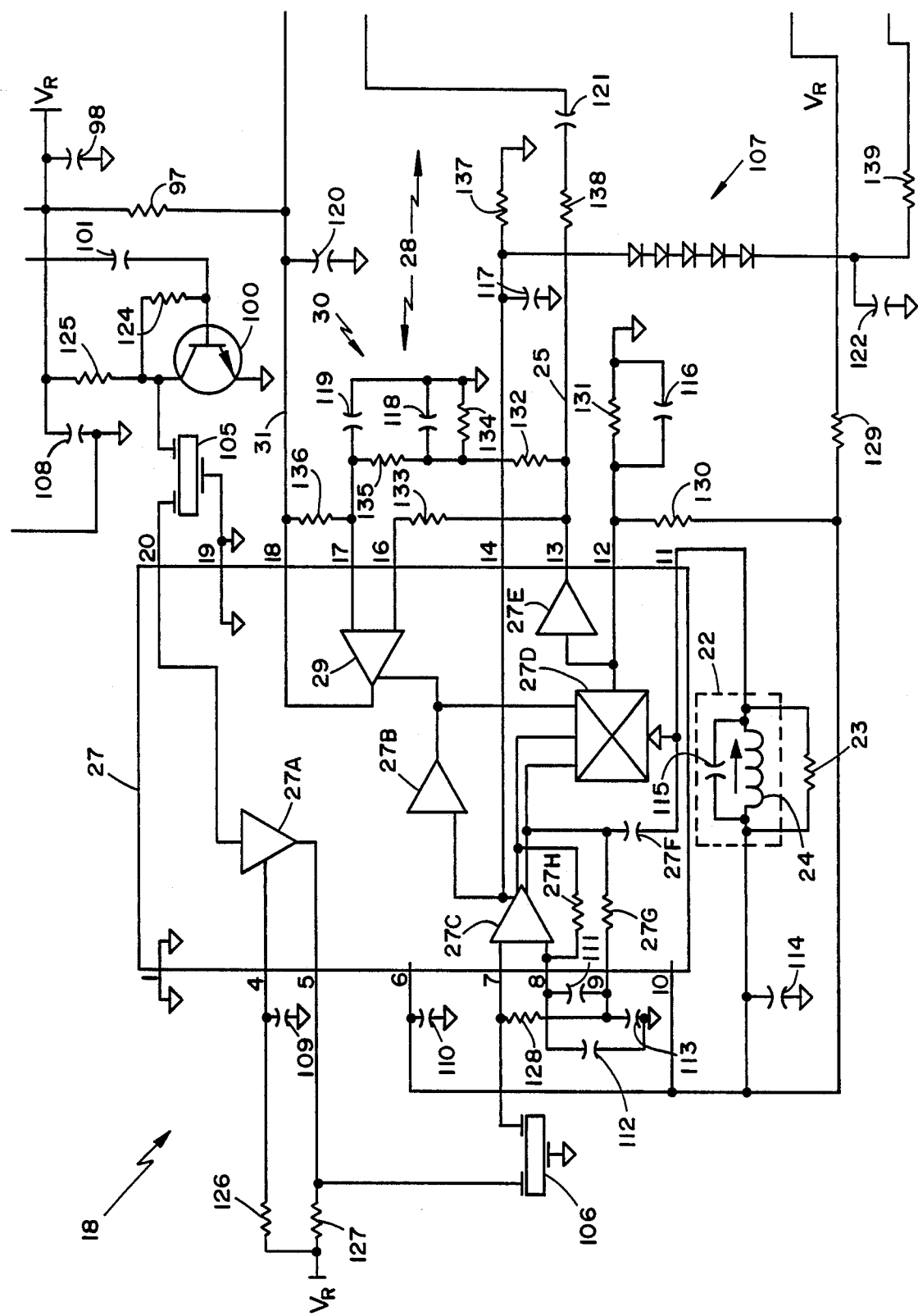
Figure 1C:
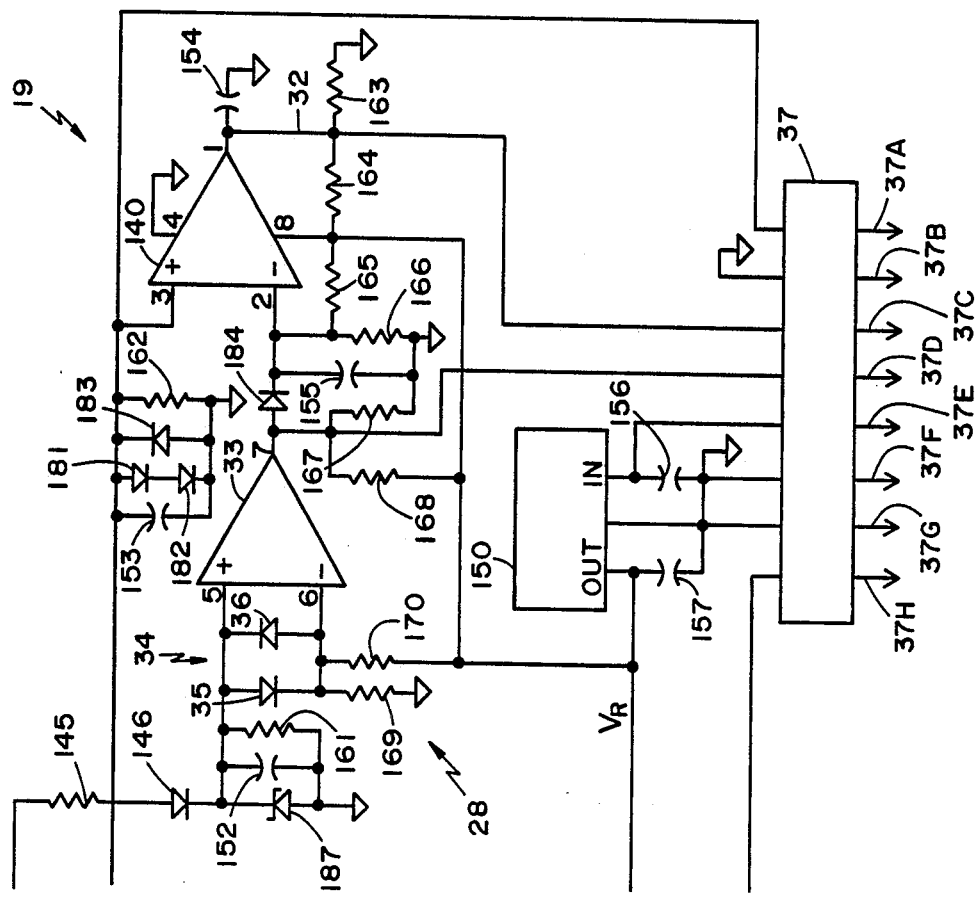

The electrical circuit of a receiver according to the invention is shown in FIGS. 1A through 1C. If these figures are placed as shown in FIG. 1, the connections between the circuit portions will be evident. The circuit can be roughly divided into the following subcircuits. An RF Amplifier 15, a Mixer 16, a Local Oscillator 17, an IF Amplifier and Detector 18, and a Data Output Enable Circuit 19. These subcircuits are indicated only generally, since rf circuits resonate and function as a whole, and some components may function in more than one capacity.

The means 20 for receiving an electromagnetic wave modulated by a message signal generally comprises antenna 21 and RF Amp 15. The received carrier wave and message signal is mixed in Mixer 16 with a lower frequency signal generated by Oscillator 17 and then sent to the Intermediate Frequency (IF) Amplifier and Detector 18. A resistor 23 placed in parallel with detecting coil 24 significantly reduces the Q ratio of the detecting circuit. The detector signal is output on line 25 (output pin 13 of the IF Amp and Detector chip 27). An output means 28 responsive to the detector signal for providing an output signal when the level of the detector signal is below a predetermined level comprises comparator 29 and its associated circuitry and the Data Output Enable circuit 19. A level sensing means 30 for sensing the level of the detector signal on line 25 comprises comparator 29 and its associated circuitry. The output of comparator 29 is low when the level of the signal on line 25 is below the predetermined level and is high when the signal is above the predetermined level. The output of comparator 29 on line 31 is applied to the Data Output Enable circuit 19 which responds to the output by passing the detector signal on line 25 to the output line 32 when the detector signal is below the predetermined level and not passing the signal on line 25 when the signal is above the predetermined level.

The output of comparator 29 on line 31 is filtered and clipped and applied to pin 5 of comparator 33. In order to maintain the fast response time of the output circuit, the filtering and clipping is limited and the signal at pin 5 of comparator 33 remains noisy. A reference signal is applied to pin 6 of comparator 33. A means 34 for enabling the reference signal to track the noisy signal comprises diodes 35 and 36. The means 34 prevents severe dips in the signal on pin 5 from tripping the comparator causing false data outputs on line 32.

Turning now to a more detailed description of the circuitry of the preferred embodiment of the invention, attention is directed to FIG. 1A. In the drawings, connections to the common ground are shown by an inverted triangle, as at 38, and connections to the positive voltage source of the system, VR, are shown as at 39. The numbers next to the input and output lines on an integrated circuit, such as the number 4 on the upper left of the oscillator circuit 17, are the pin numbers for these IC's. The receiving section includes antenna 21, coils 41 through 45, transistors 46 and 47, variable capacitors 48, 49 and 50, capacitors 52 through 66, and resistors 68 through 73. Antenna 21 is connected to one side of coil 41, variable capacitor 48 and capacitors 53 and 54 through capacitor 52. The other sides of coil 41, variable capacitor 48 and capacitor 54 are connected to the common ground. The other side of capacitor 53 is connected to the base of transistor 46. The emitter of transistor 46 is connected to ground and the collector is connected to its base through coil 43 and resistor 68 and capacitor 56, the latter two in parallel. The side of coil 43 opposite transistor 46 is connected to ground through capacitor 57 and to the positive voltage source, VR, through resistor 69 and coil 42. The side of coil 42 connected to VR is also connected to ground through capacitor 55. The line between resistor 69 and coil 42 is connected to one side of the primary coil of transformer 77 in Mixer 16 and to ground through capacitor 66. The collector of transistor 46 is also connected to ground through capacitor 58 and variable capacitor 49 in parallel, and to one side of coil 44 through capacitor 59. The other side of coil 44 is connected to ground through capacitor 61 and to the base of transistor 47. The emitter of transistor 47 is connected to ground. The collector of transistor 47 is connected to ground through capacitor 63 and variable capacitor 50 in parallel and also through coil 45 and capacitor 62. The side of coil 45 opposite transistor 47 is also connected to one side of the primary coil of transformer 77 in the Mixer 16 through resistor 71, and to the side of coil 44 opposite the base of the transistor through resistor 70 and capacitor 60 in parallel. The collector of transistor 47 is also connected to gate 1 of converter 80 in Mixer 16 through capacitors 64 and 65. The line between the two capacitors is connected to ground through resistor 72, and gate 1 of converter 80 is connected to ground through resistor 73.

The Mixer 16 comprises converter 80, variable transformer (selector) 77, capacitors 84 through 87 and resistors 90 through 92. Gate 2 of converter 80 is connected to ground through resistor 90, to its drain through resistor 92, and to the number 4 pin of oscillator hybrid circuit 95 through capacitor 87. The drain is also connected to the side of the primary coil of transformer 77 opposite to the connections discussed above. The source of converter 80 is connected to ground through resistor 91 and capacitor 84 connected in parallel. Capacitor 85 is connected across the primary coil of transformer 77, while capacitor 86 is connected across the secondary coil. One side of the secondary coil is connected to ground while the other side is connected to the gate of transistor 100 in the IF Amp section (FIG. 1B) through capacitor 101.

The oscillator comprises hybrid circuit 95, and coil 96. Pins 2, 3, 6 and 7 of hybrid circuit 95 are grounded. Pin 5 is connected to pin 8. Pin 8 and pin 1 are connected to one side of coil 96. The other side of coil 96 is connected to the positive system voltage VR.

Turning now to FIG. 1B, the IF Amp and detector circuit is shown. This circuit includes transistor 100, integrated circuit 27, coil 24, filters 105 and 106, capacitors 98, 101, and 108 through 122, resistors 23, 97 and 124 through 139 and diodes (five) 107. The gate of transistor 100 is connected to its collector through resistor 124 and the emitter is connected to ground. The collector of transistor 100 is connected to one side of resistor 125 and to the input of filter 105. The other side of resistor 125 is connected to ground through capacitor 108, to ground through capacitor 98, and to the VR voltage. The ground terminal of filter 105 is connected to ground and the output is connected to the number 20 pin of IC 27. The number 1 and number 19 pins of IC 27 are grounded. The number 4 pin is connected to ground through capacitor 109 and to the VR voltage through resistor 126. The number 5 pin is connected to VR through resistor 127 and to the input of filter 106. The ground of filter 106 is grounded and its output is connected to pin 7 and to one side of resistor 128. The other side of resistor 128 is connected to pin 9 and to ground through capacitor 113. Pin 8 is connected to pin 9 through capacitor 111 and to ground through capacitor 112. Pin 6 of IC 27 is connected to ground through capacitors 110 and 114 in parallel, to pin 10, to the VR voltage through resistor 129, to pin 12 through resistor 130, and to one side of coil 24. The other side of coil 24 is connected to pin 11. Capacitor 115 and resistor 23 are connected across coil 24 in parallel. Pin 12 is also connected to ground through resistor 131 and capacitor 116 in parallel. Pin 13 of IC 27 is connected to pin 16 through resistor 133, to one side of resistor 132, to the non-inverting input (pin 3) of comparator 140 in the Data Output Enable circuit (FIG. 1C) through resistor 138 and capacitor 121. The other side of resistor 132 is connected to ground through resistor 134 and capacitor 118 in parallel and to pin 17 of IC 27 through resistor 135. Pin 17 of IC 27 is also connected to ground through capacitor 119 and to pin 18 through resistor 136. Pin 18 is also connected to ground through capacitor 120, to the VR voltage through resistor 97, and to the non-inverting input of comparator 33 (FIG. 1C) through resistor 145 and diode 146, with the cathode of the diode toward the input. Pin 14 of IC 27 is connected to ground through capacitor 117 and resistor 137 in parallel, to ground through diodes 107 (five total) and capacitor 122 with the cathode of the diodes toward ground. The line between diodes 107 and capacitor 122 is connected to the Relative Signal Strength Output 37H (FIG. 1C) through resistor 139. IC 27 is preferably a Motorola MC3356 sideband FSK Receiver available from Motorola Semiconductors, P. O. Box 20912, Phoenix, Ariz. 85036 and will not be discussed in detail herein. To assist in understanding the invention, the following internal components are shown: operational amplifier 27A, comparator 27B, limiter 27C, quadrature detector 27D, buffer 27E, capacitor 27F, resistors 27G and 27H, and noise level comparator 29. It is noted that the use of comparator 29 is different than intended by Motorola, i.e. it is used as a noise comparator rather than a data shaping comparator.

Turning now to FIG. 1C, the Data Output Enable circuit is shown. The circuit includes comparators 33 and 140, connector 37, voltage regulator 150, capacitors 152 through 157, resistors 145 and 161 through 170, diodes 35, 36, 146, and 181 through 184, and zener diode 187. The non-inverting input of comparator 33 is connected to ground through zener diode 187, capacitor 152 and resistor 161 connected in parallel with the cathode of the diode toward the input, and to the inverting input through diodes 36 and 36 connected in parallel with the direction of the diodes opposite to one another. The inverting input is also connected to ground through resistor 169 and to the VR voltage through resistor 170. The output (pin 7) of comparator 33 is connected to the inverting input of comparator 140 through diode 184 with the cathode of the diode toward the input. The output of comparator 33 is also connected to the VR voltage through resistor 168, to ground through resistor 167, and to the Carrier Detect output 37D. The inverting input (pin 2) of comparator 140 is also connected to ground through capacitor 155 and resistor 166 connected in parallel and to the VR voltage through resistor 165. The number 8 pin of comparator 140 and comparator 33 are connected to the VR voltage and the number 4 pin is connected to ground. The non-inverting input (pin 3) of comparator 140 is connected to ground through resistor 152, capacitor 153, and diode 183 in parallel with the anode of the diode toward ground. Pin 3 is also connected to ground through diodes 181 and 182 in series, with the cathode of the diodes toward ground. Pin 3 of comparator 140 is also connected to the Alignment Output 37A. The output (pin 1) of comparator 140 is connected to ground through capacitor 154 and to the Data Out output 37C. Optionally, the output of comparator 140 may also be connected to VR through resistor 164 and to ground through resistor 163. The positive output of voltage regulator 150 provides the VR voltage and is also connected to ground through capacitor 157; the ground terminal is connected to ground and output 37F; the input is connected to a 10-15 VCD source via input 37E.

In the preferred embodiment of the invention, the component parts are as follows. Antenna 21 is either a whip or a remote antenna on a coaxial cable. Transistors 46, 47 and 100 are type 2SC-3302, converter 80 is a NEC 41137, selector 77 is a Cord Y5796 (MURA), local oscillator 17 is a H0-1001 hybrid circuit, filters 105 and 106 are 10.7M hertz ceramic filters with ±200K hertz minimum bandwidth, integrated circuit 27 is a Motorola MC3356 Wideband FSK receiver, detector (including 1.5 microHenry coil 24 and 100 picofarad capacitor 115) is a KACS-K586HM, cmparator 33 and 140 are on a single IC type LM 393, voltage regulator 150 is a type 78L09, zener diode 187 is a type 1N747A, diodes 107 (five total) 146, 35, 36, 181, 182 and 183 are type 1N4148, coils 41, 42, 43, 44 and 45 are (approximately) 1 μH, 22 μH, 4 μH, 4 μH, and 1 μH respectively, variable capacitors 48, 49 and 50 are 2–20 picofarads, capacitors 54 and 86 are 10 picofarads, capacitors 52, 53, 56, 58, 60, 61, 63 and 64 are 3.3 picofarads, capacitors 55, 153 and 0.001 microfarad, capacitors 66, 84, 98, 101, 108, 109, 110, 111, 112, 113, and 121 are 0.01 microfarad, capacitors 65, 118, 119, 120, 122 and 152 are 0.0047 microfarad, capacitor 85 is a 68 picofarad, capacitor 87 is a 47 picofarad, capacitor 59 is a 5 picofarad, capacitors 57, 64, 114, 156 and 157 are 0.1 microfarad, capacitor 115 is a 100 picofarad, capacitors 116, 117, 154 and 155 are 470 picofarad, resistors 68 and 90 are 68K ohm, resistor 70 is 56K ohm, resistors 69, 127, 128 and 133 are 330 ohm, resistors 72 and 91 are 120 ohm, resistors 73, 132 and 136 are 47K ohm, resistors 92 and 125 are 680 ohm, resistor 134 is 390K ohm, resistors 136 and 165 are 1 Meg ohm, resistors 139 and 145 are 10K ohm, resistors 163, 164, 166, 167 and 168 are 4.7K ohm and resistors 71, 73, 97, 124, 126, 23, 130, 131, 137, 138, 162, 169 and 170 are 150 ohm, 47K ohm, 1.5K ohm, 100K ohm, 180 ohm, 2.2K ohm, 15K ohm, 18K ohm, 20K ohm, 1K ohm, 470K ohm, 2K ohm and 91K ohm respectively. Connector 37 is an eight pin molex male connector.

Figure 2A:
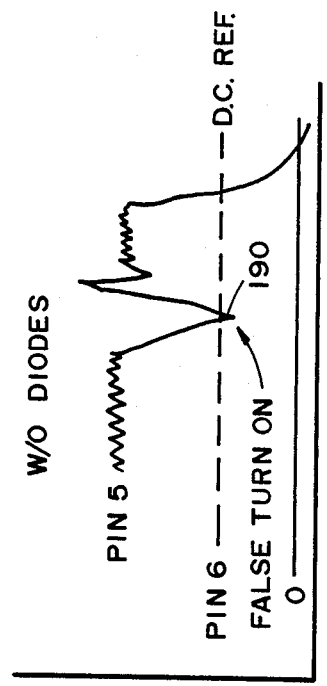
Figure 2B:
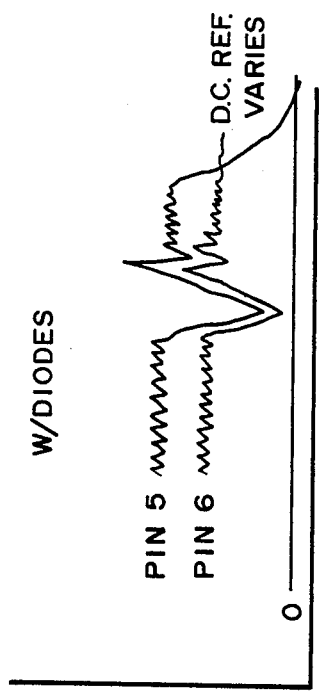

The circuit operates as follows. Antenna 21 produces an approximately 1 microvolt signal. The RF Amp section 15 comprises an active Butterworth filter having a relatively high Q and bandpass that eliminates interference common to many receivers. This minimizes mixer products that could cause desensitization of over all receiver gain. The signal is amplified by transistors 46 and 47 as it is filtered to select a signal of 318 megahertz ±1 megahertz with other frequencies at ±1.8 megahertz attenuated by at least 20 db. Each transistor amplifies the signal by a factor of 5 or 6. The Mixer section 16 converts the signal from UHF to VHF by heterodyning the 318 megahertz signal with a 307 megahertz signal produced by oscillator 17. Selector 77 selects the 10.7 megahertz sum frequency from the converter 80. Transistor 100 amplifies the 10.7 megahertz signal. The signal is amplified further within IC 27 and filtered by ceramic filters 105 and 106 and then enters the detector circuit, the principal elements of which are quadrature detector 27D and quadrature detector tank 22. The detector circuit detects the frequency shift and separates the message signal from the 10.7 megahertz signal. Buffer 27E amplifies the message signal and isolates the detector circuitry to avoid distortion. The signal output on pin 13 of IC 27 (line 25) is noisy. When no message signal is being received by the receiver, the noise on line 25 is 1 volt or greater. Upon reception of a message signal the amplitude of the signal on line 25 dips to 0.2 to 0.3 volts. The noisy signal is the result of the wider bandwidth that is obtained by lowering the circuit Q of the detect circuitry. The lever sensing circuitry 30 is designed so that the signals on pins 16 and 17 of IC 27 respond differently to the signal on line 25 and when the signal on line 25 is the noisy 1 volt or greater signal, the signal on pin 17 is greater than the signal on pin 16 and the output of comparator 39 is high (comparator on). When a message signal is received, the signal on pin 17 is less than or equal to the signal on pin 16 and the output of comparator 29 is low (comparator off). The output of comparator 29 on line 31 is rectified by diode 146 and filtered by zener diode 187, which serves as a peak filter and voltage level limiter, and capacitor 152 and resistor 151, and then applied to pin 5 of comparator 33. The filtering is kept minimal so as to maintain a response time of about 1 millisecond. Thus the signal on pin 5 remains noisy. A reference voltage is applied to pin 6 of comparator 33. When comparator 29 turns off, the signal on line 31 goes low and capacitor 152 discharges with a time constant determined by its value and the value of resistor 161. When the discharge is sufficient so that the voltage on pin 5 is equal to the reference voltage on pin 6, the comparator 33 turns off and its output (pin 7) goes low. The data or message signal on line 25 is applied to pin 3 of comparator 140. Resistor 138, capacitor 121, and a signal shaping circuit comprising capacitor 153, diodes 181-183 and resistor 162 cut this signal to about 0 to 0.15 volts at pin 3. The voltage at pin 2 of comparator 140 will be about 3.5 volts while comparator 33 is on, i.e. when there is no received carrier signal, which will hold the comparator 140 off. When a signal is received, the signal on pin 2 of comparator 140 drops to approximately zero, comparator 140 turns on, and the data signal input on pin 3 is output on pin 1 of comparator 140. The signal on pin 7 of comparator 33 also serves as a Carrier Detect Out signal (on output 37D) which will be high when there is no carrier and low when a carrier is detected. Diodes 35 and 36 permit the reference signal on pin 6 of comparator 33 to track or follow the signal on pin 5 to some degree to prevent false data outputs. FIG. 2A illustrates the signals with the tracking. As can be seen at point 190, without tracking a severe noise dip can turn on comparator 33. However, when pin 6 is allowed to track pin 5 the voltage on pin 6 also falls off at the noise dip and the comparator does not turn on. Generally, diodes 35 and 36 keep pin 5 and pin 6 of comparator 33 about 0.4 volts apart while comparator 29 is on.

A feature of the receiver according to the invention is that it provides a wide bandwidth, preferably of the order of ±200K hertz, and yet can receive a modulated signal with a small frequency deviation, for example as small as 50-80K hertz.

The wideband results in a noisy signal. Another feature of the invention is the unique squelch circuit. The normal squelch circuit reduces the noise during the "not receiving" mode, which also reduces the sensitivity. The squelch design of the invention does the opposite; it increases the noise above the level of the message signal and uses it to gate the output.

Reducing the noise in the squelch and output circuits (as in the prior art) requires capacitive filtering which also reduces the response time of the output circuit. Typically, the prior art output enable-squelch circuits have response times of greater than ½ second. A further feature of the invention is an output enable-squelch circuit response time of 1 to 1.5 milliseconds.

The active Butterworth filter of the RF Amp 15 is another feature of the invention. Generally, Butterworth filters are passive and do not amplify the signal. Coils such as 44, in series with capacitors such as 61, to ground is another unique feature of the invention. Such coils and capacitors in series provide a tunable series circuit which is useful in tuning the active Butterworth circuit.

A further feature of the invention is the use of the heterodyne sum frequency rather than the difference frequency.

Yet another feature of the invention is the use of a single coil quadrature detector coil 24. Generally, 2 coil detector circuits are employed, which circuits invert the signal, which can create inverted, erroneous data leading to communication problems.

Another feature of the invention is the use of ceramic filters 105 and 106. These filters remove the image signals from the received wave and also do not require tuning. The ability of the circuit according to the invention to be tuned in one step is a further feature of the invention.

A novel electromagnetic wave receiver which permits wide bandwidth, high sensitivity, and fast response time has been described. Although the invention has been described in terms of specific embodiments, this is not intended to limit the invention. It is evident that those skilled in the art may now make many uses and modifications of the embodiments described, without departing from the inventive concepts. For example, other equivalent parts and electronic components may be used. Some elements can be eliminated; for example not all receivers amplify in the RF section. Other elements may be added. Consequently, the invention is to be construed as embracing each and every novel feature and novel combination of features present in the receiver described.

What is claimed is:

1. A receiver comprising:
   means for receiving an electromagnetic carrier wave frequency modulated by a message signal said carrier wave characterized by a modulation frequency change,
   detector circuit means for separating said message signal from said carrier wave and for producing a detector signal which includes said message signal, said detector circuit means characterized by a detectable bandwidth and having a Q ratio sufficiently low that the detectable bandwidth is more than twice as large as the modulation frequency change; and output means responsive to said detector signal for providing an output signal when said carrier wave is being received.

2. The receiver of claim 1 wherein said means for receiving includes an active Butterworth filter.

3. A receiver comprising:
circuit means for receiving an electromagnetic carrier wave modulated by a message signal,
detector circuit means for separating said message signal from said carrier wave and for producing a detector signal which includes said message signal,
output means responsive to said detector signal for producing an output signal, said output means including a reference voltage input, a noisy input related to said detector signal, and a means for enabling the signal on said reference input to track the signal on said noisy input to prevent false data outputs.

4. A receiver comprising:
circuit means for receiving an electromagnetic carrier wave frequency modulated by a message signal;
detector circuit means for separating said message signal from said carrier wave and for producing a detector signal which includes said message signal; and
output means response to said detector signal for producing an output signal, said output means having a response time of less than approximately 2.5 milliseconds.

* * * * *